(12) United States Patent
Hamilton et al.

(10) Patent No.: US 12,235,335 B2
(45) Date of Patent: Feb. 25, 2025

(54) DIAGNOSTIC DEVICE FOR THE CHARACTERIZATION OF ELECTROMAGNETIC MATERIAL PROPERTIES

(71) Applicant: Government of the United States, as represented by the Secretary of the Air Force, Wright-Patterson AFB, OH (US)

(72) Inventors: Andrew J. Hamilton, Dayton, OH (US); James Park, Springfield, VA (US); Woo Yong Jang, Xenia, OH (US); Nathan E. Zechar, Mason, OH (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 322 days.

(21) Appl. No.: 17/989,253

(22) Filed: Nov. 17, 2022

(65) Prior Publication Data
US 2023/0243900 A1    Aug. 3, 2023

Related U.S. Application Data

(60) Provisional application No. 63/284,139, filed on Nov. 30, 2021.

(51) Int. Cl.
*G01R 33/12* (2006.01)
*G01R 27/26* (2006.01)

(52) U.S. Cl.
CPC ..... *G01R 33/1223* (2013.01); *G01R 27/2617* (2013.01); *G01R 27/2694* (2013.01)

(58) Field of Classification Search
None
See application file for complete search history.

(56) References Cited

U.S. PATENT DOCUMENTS

| | | | | |
|---|---|---|---|---|
| 3,500,264 A | * | 3/1970 | Flyod, Jr. | H01P 1/042 |
| | | | | 285/369 |
| 5,400,004 A | * | 3/1995 | Moeller | H01P 1/08 |
| | | | | 333/252 |
| 5,629,657 A | * | 5/1997 | Bayorgeon | H01P 1/042 |
| | | | | 333/254 |

(Continued)

OTHER PUBLICATIONS

Hyde, M.; Havrilla, M.; High-Temperature RF Material Characterization Using a Dual-Chambered Rectangular Waveguide Fixture, EEE Transactions On Instrumentation and Measurement, 2017, 66, 9, 2421-2327.

(Continued)

*Primary Examiner* — Nasima Monsur
(74) *Attorney, Agent, or Firm* — AFMCLO/JAZ; James F. McBride

(57) ABSTRACT

The present invention relates to diagnostic device for the characterization of electromagnetic material properties and a method of making and using same. Unlike current diagnostic devices, the diagnostic device comprises a novel waveguide system and is suitable for the characterization of electromagnetic material properties such as permittivity, permeability, and the loss tangent of materials over a broad temperature and pressure range.

21 Claims, 14 Drawing Sheets

Waveguide system

(56) References Cited

U.S. PATENT DOCUMENTS

2003/0137465 A1* 7/2003 Graczyk ................ H01P 1/042
                                                                385/39
2008/0053988 A1* 3/2008 Arai ........................ H05B 6/78
                                                                219/121.36

OTHER PUBLICATIONS

WHS Sondermetalle GmbH & Co. KG Data Sheet.
Martinz, H. P.; Nigg, B.; Matej, J.; Sulik, M.; Larcher, H.; Hoffmann, A.; Properties of The Sibor® Oxidation Protective Coating On Refractory Metal Alloys, 2006, 67-84.
Larsson, C.; Sjöberg, D.; Elmkvist, L.; Waveguide measurements of the permittivity and permeability at temperatures up to 1000 C, 2010, 1-22.

* cited by examiner

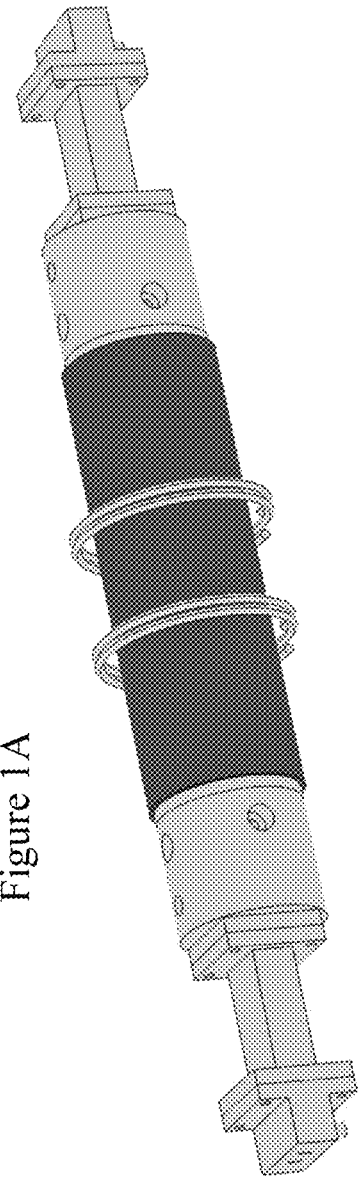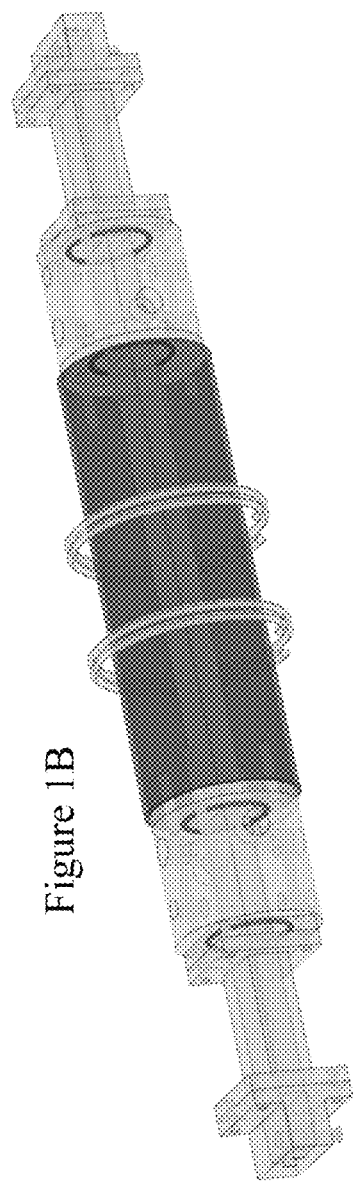
Waveguide system – Assembled
Figure 1A
Figure 1B

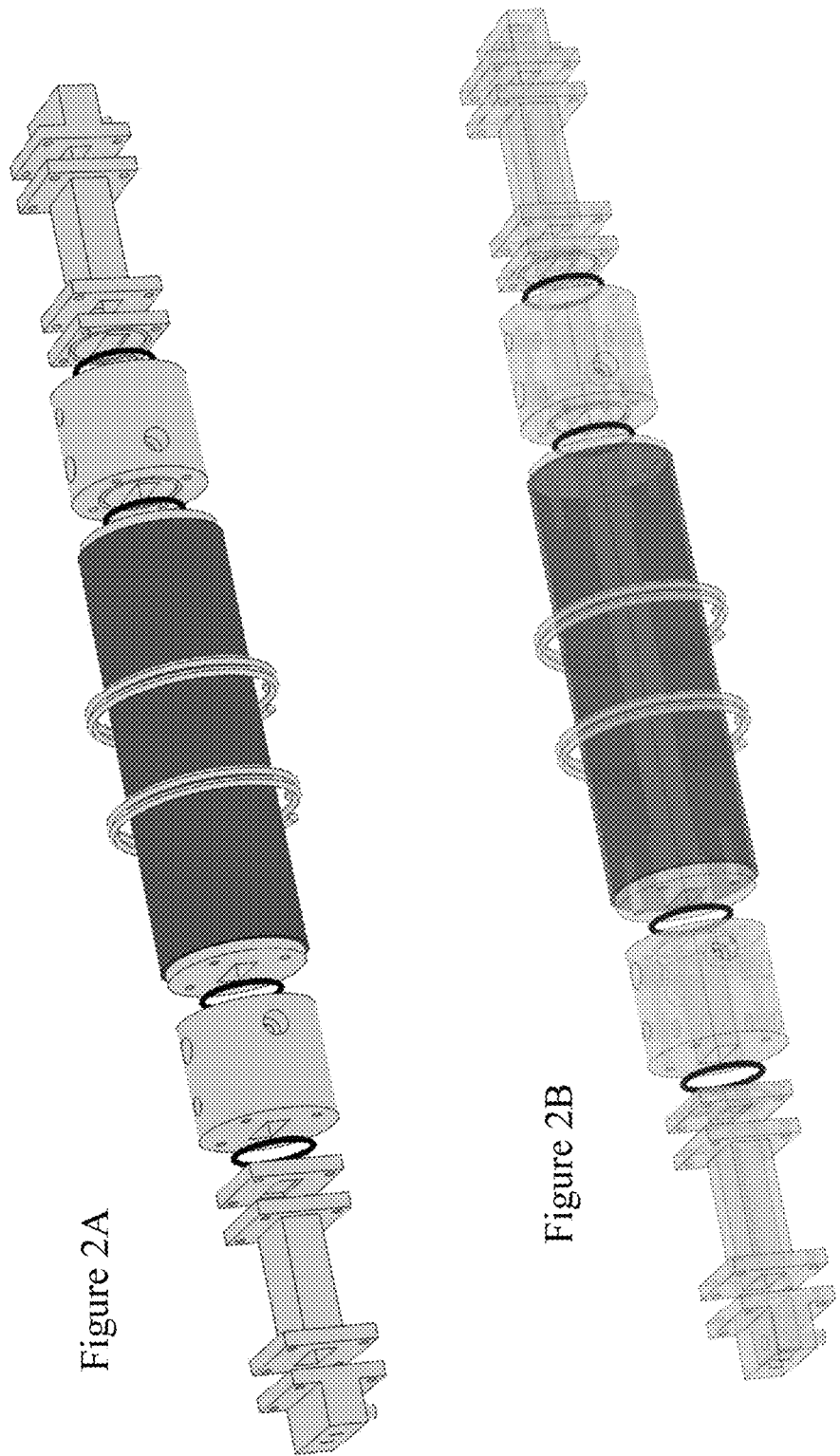

High Temperature Waveguide – Side

Vacuum/Pressure Cooling Component - Front

Vacuum/Pressure Cooling Component – Back

Vacuum/Pressure Cooling Component – Side

Vacuum/Pressure Cooling Component – Side2

Waveguide Vacuum/Pressure Window – Front

Waveguide Vacuum/Pressure Window – Back

Waveguide Straight Section

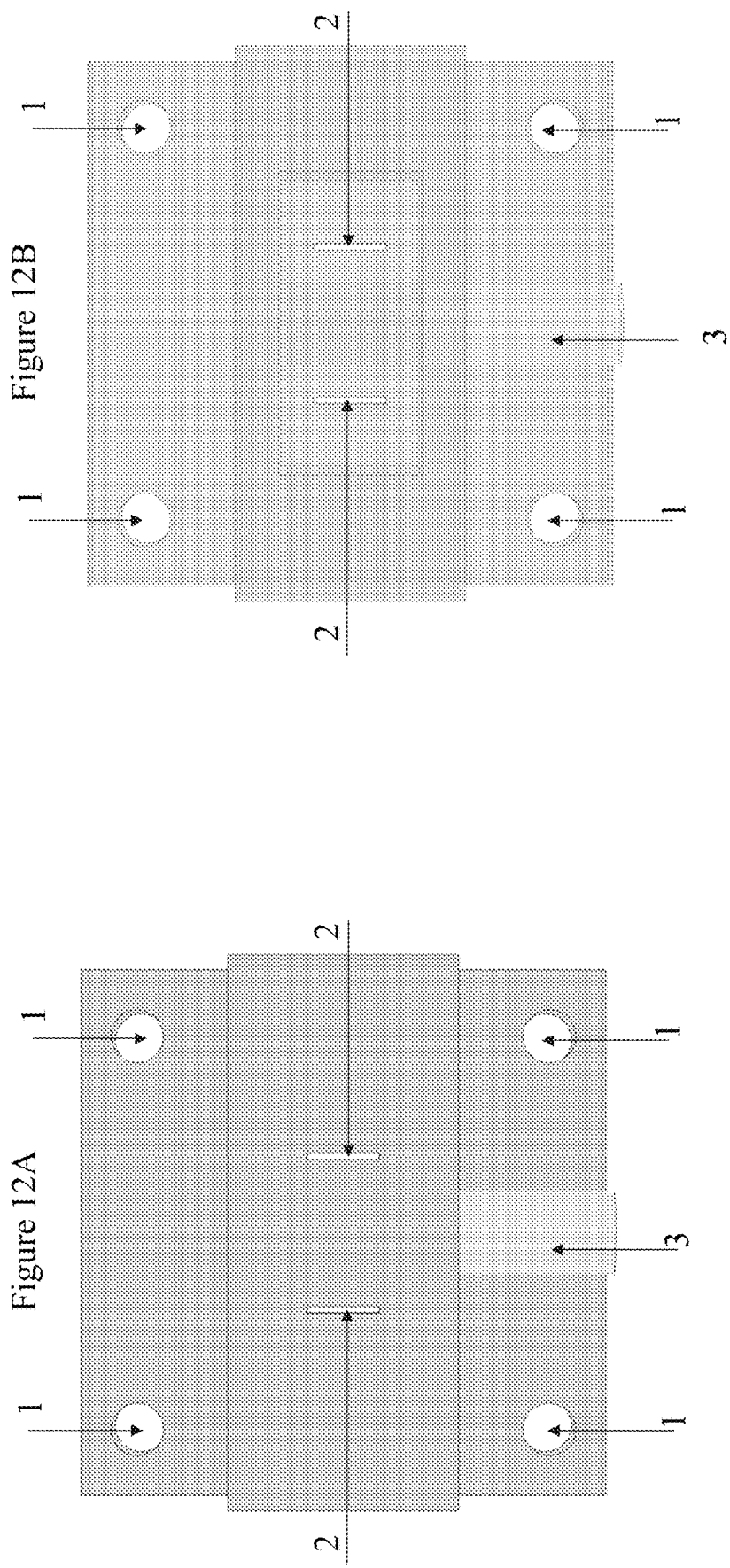

Waveguide adapter with temperature view windows— Front

Waveguide adapter with thin slit – Side

DIAGNOSTIC DEVICE FOR THE CHARACTERIZATION OF ELECTROMAGNETIC MATERIAL PROPERTIES

CROSS-REFERENCE TO RELATED APPLICATION

The present application claims priority to U.S. Provisional Application Ser. No. 63/284,139 filed Nov. 30, 2021, the contents of which is hereby incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to diagnostic device for the characterization of electromagnetic material properties and a method of making and using same.

BACKGROUND OF THE INVENTION

The need for high performance materials has been increasing by leaps and bounds due to the explosion new technologies such hypersonic flight. Unfortunately, the ability to test such materials at the extreme conditions that are required by their end use has as remained not been adequately explored due to the speed of the developments in the technology area. In particular, the ability to assess the permittivity, permeability, and the loss tangent of materials of high performance materials at extreme conditions has not been addressed. Applicants recognized that the source of the problem was found in the design and composition of test fixtures as well as the manner in which the test conditions were generated. Unlike current diagnostic devices, the disclosed diagnostic device is suitable for the characterization of electromagnetic material properties such as permittivity, permeability, and the loss tangent of materials over a broad temperature and pressure range. The disclosed diagnostic device employs inductive heating coupled with a novel waveguide system, inert gas pressurization or vacuum capability, a fluid cooling system and an advanced sensor and analysis system to achieve the aforementioned benefits.

SUMMARY OF THE INVENTION

The present invention relates to diagnostic device for the characterization of electromagnetic material properties and a method of making and using same. Unlike current diagnostic devices, the disclosed diagnostic device comprises a novel waveguide system and is suitable for the characterization of electromagnetic material properties such as permittivity, permeability, and the loss tangent of materials over a broad temperature and pressure range.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 1A is an isometric view of an assembled waveguide system comprising coil heater.

FIG. 1B is an isometric transparent view of an assembled waveguide system comprising coil heaters.

FIG. 2A is an isometric view of a disassembled waveguide system comprising coil heaters.

FIG. 2B is an isometric transparent view of a disassembled waveguide system comprising coil heater.

FIG. 12A is a back view of a waveguide adapter component of waveguide system wherein said waveguide adapter comprises optional slits.

FIG. 12B is a transparent back view of a waveguide adapter component of waveguide system wherein said waveguide adapter comprises optional slits.

DETAILED DESCRIPTION OF THE INVENTION

Definitions

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

As used herein, the words "and/or" means, when referring to embodiments (for example an embodiment having elements A and/or B) that the embodiment may have element A alone, element B alone, or elements A and B taken together.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

DETAILED DESCRIPTION OF THE INVENTION

Waveguide System

Applicants disclose a waveguide system. FIGS. 1 through 14 of the present specification disclosed non-limiting embodiments of Applicants; waveguide system and the components of such wave guide system. As should be understood by the skilled artisan, the components of Applicants' waveguide system may be supplied separately or as integral systems.

Figure 3:
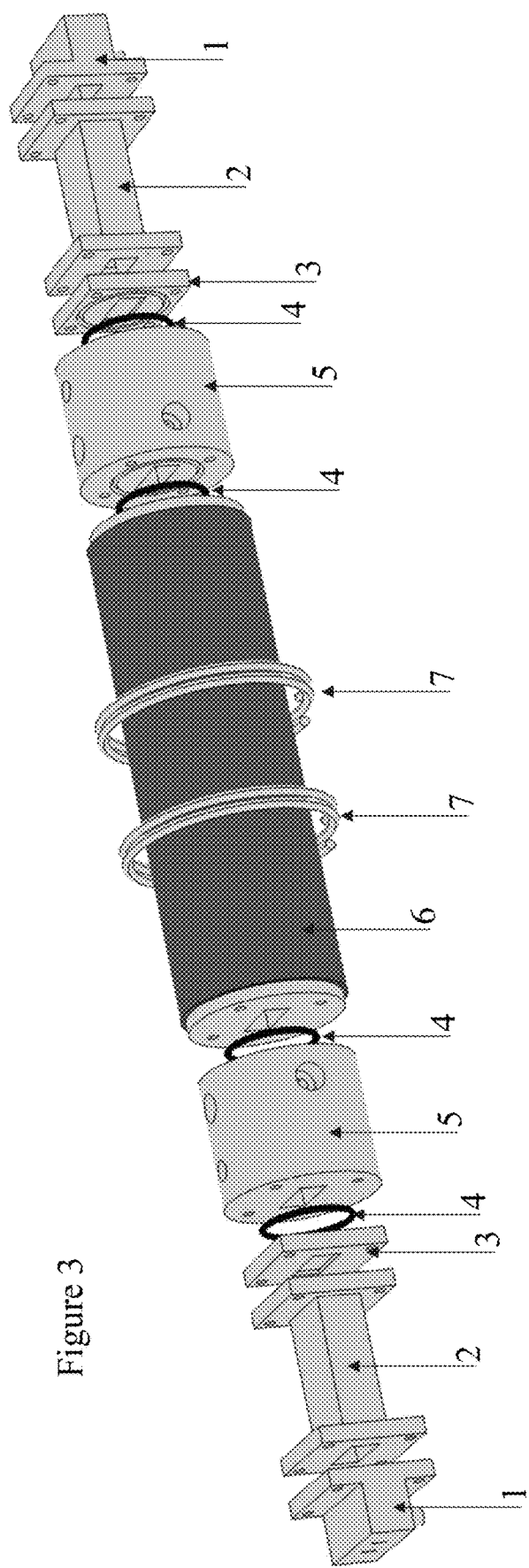
FIG. 3 an isometric view of a disassembled waveguide system comprising coil heaters wherein the components of the waveguide system are labeled.

FIG. 3 an isometric view of a disassembled waveguide system comprising coil heaters wherein the components of the waveguide system are labeled. Such figure depicts first and second waveguide adapters (1), first and second straight wave guides (2), first and second vacuum/high pressure waveguide windows (3), first, second, third and fourth o-rings (4), first and second vacuum/pressure cooling components (5), high temperature waveguide (6) and first and second coil heaters (7).

Figure 4A:
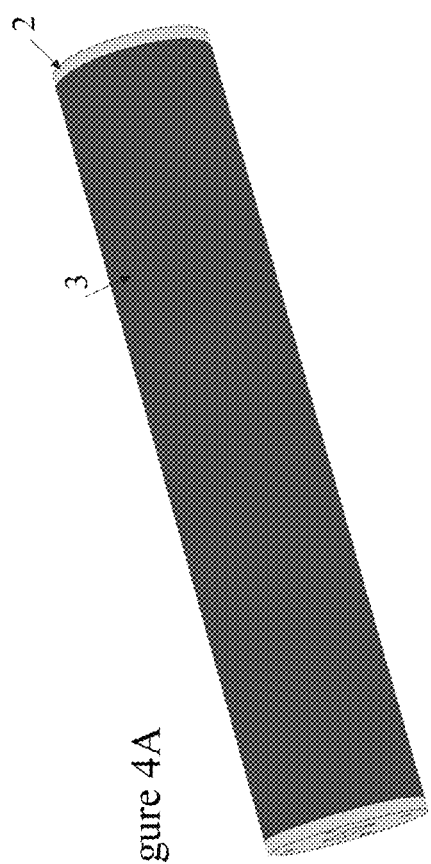
FIG. 4A an isometric side view of a high temperature waveguide component of a waveguide system.

FIG. 4A an isometric side view of a high temperature waveguide component of a waveguide system. Such figure depicts a refractory metal (2), and an oxidation protective coating (3).

Figure 4B:
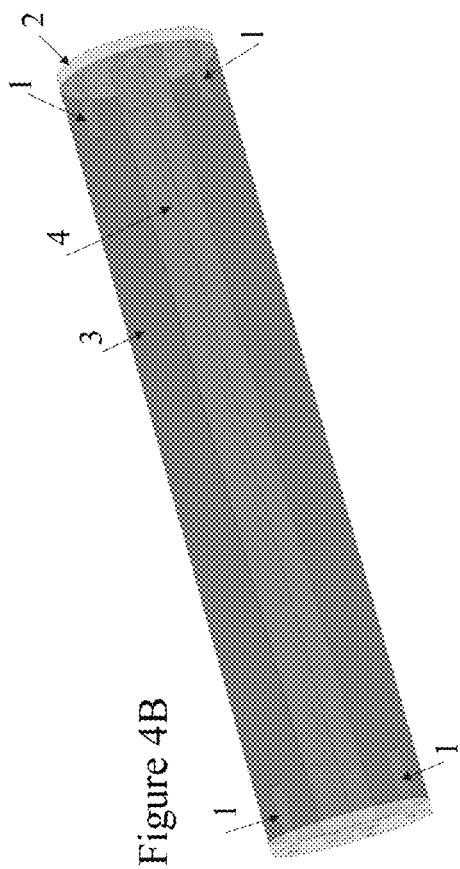
FIG. 4B an isometric, transparent side view of a high temperature waveguide component of a waveguide system.

FIG. 4B an isometric, transparent side view of a high temperature waveguide component of a waveguide system. Such figure depicts provisions for threaded rod (1), a refractory metal (2), an oxidation protective coating (3), and a waveguide through hole.

Figure 5A:
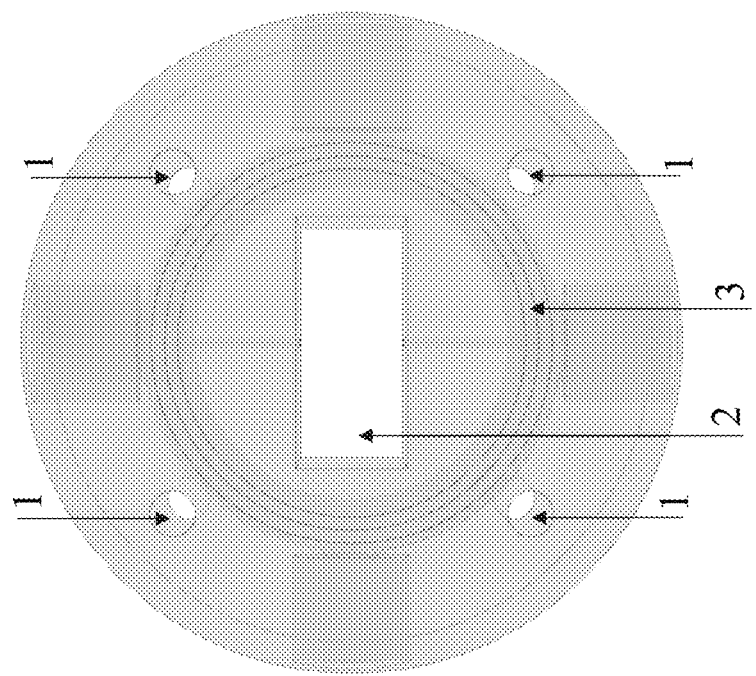
FIG. 5A is a front view of a vacuum/pressure cooling component of a waveguide system.

FIG. 5A is a front view of a vacuum/pressure cooling component of a waveguide system. Such figure depicts provisions for bolts (1), a waveguide through hole (2), and a groove for an o-ring (3).

Figure 5B:
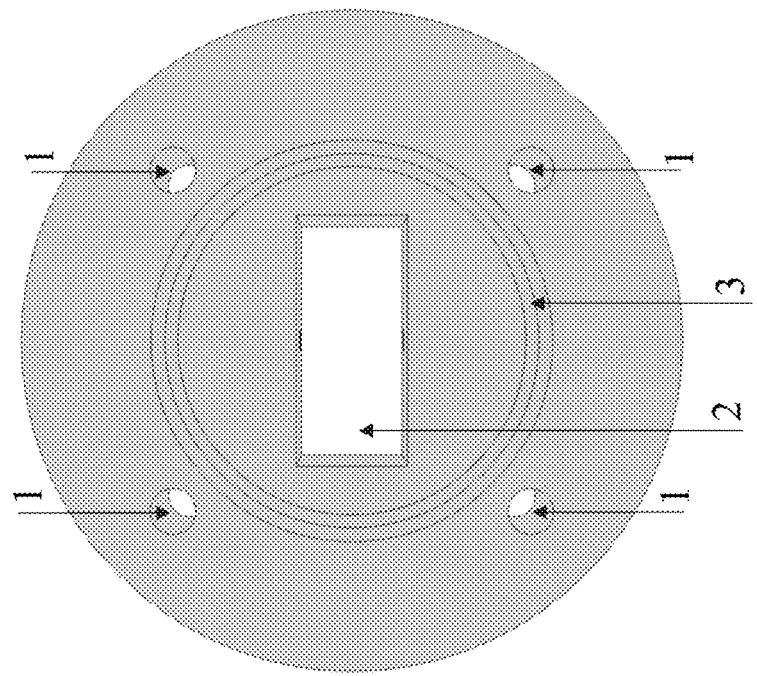
FIG. 5B is a transparent front view of a vacuum/pressure cooling component of a waveguide system.

FIG. 5B is a transparent front view of a vacuum/pressure cooling component of a waveguide system. Such figure depicts provisions for bolts (1), a waveguide through hole (2), and a groove for an o-ring (3).

Figure 6A:
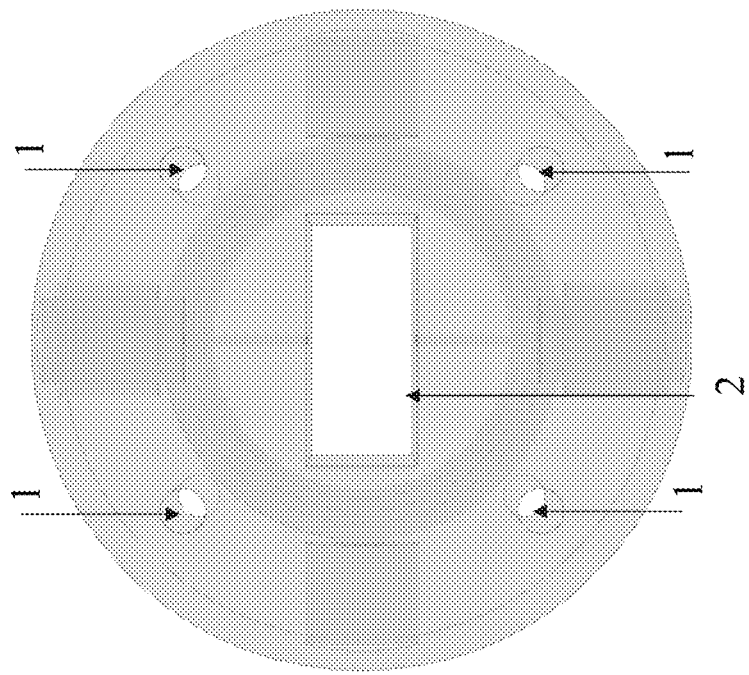
FIG. 6A is a back view of a vacuum/pressure cooling component of a waveguide system.

FIG. 6A is a back view of a vacuum/pressure cooling component of a waveguide system. Such figure depicts provisions for bolts (1), and a waveguide through hole (2).

Figure 6B:
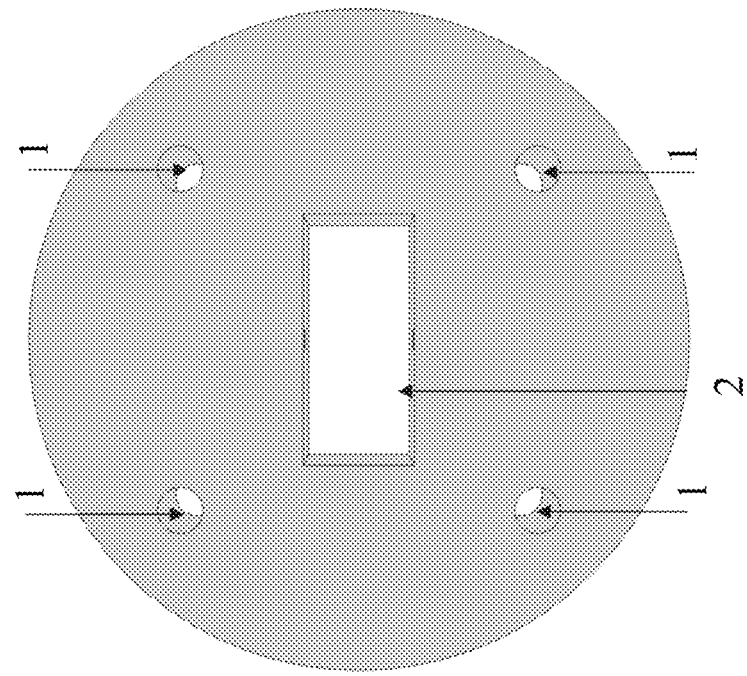
FIG. 6B is a transparent back view of a vacuum/pressure cooling component of a waveguide system.

FIG. 6B is a transparent back view of a vacuum/pressure cooling component of a waveguide system. Such figure depicts provisions for bolts (1), and a waveguide through hole (2).

Figure 7B:
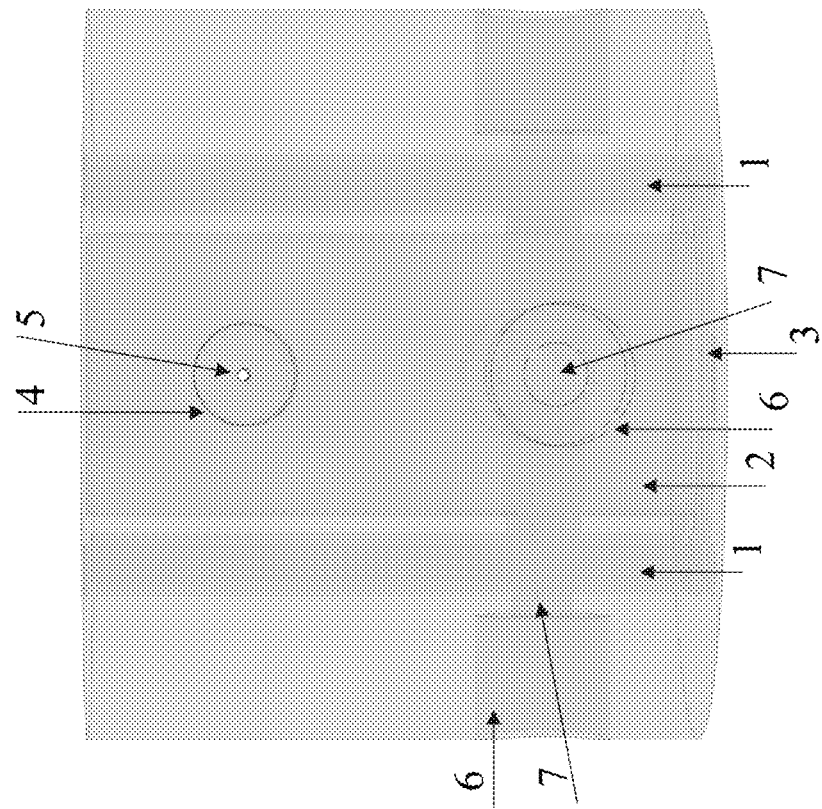
FIG. 7B is a transparent side view of a vacuum/pressure cooling component of a waveguide system.
Figure 7A:
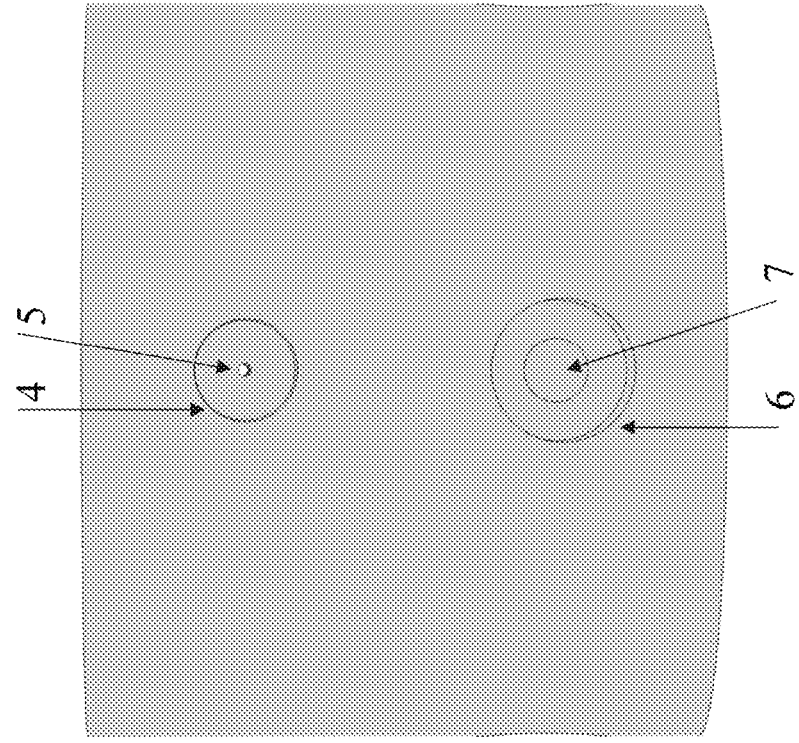
FIG. 7A is a side view of a vacuum/pressure cooling component of a waveguide system.

FIG. 7A is a side view of a vacuum/pressure cooling component of a waveguide system. Such figure depicts provisions for vacuum fittings (4), a vacuum through hole to the waveguide section (5), provisions for water cooling connections (6), and a liquid cooling channel (7).

FIG. 7B is a transparent side view of a vacuum/pressure cooling component of a waveguide system. Such figure depicts provisions for bolts (1), a waveguide through hole (2), and a groove for an o-ring (3), provisions for vacuum fittings (4), a vacuum through hole to the waveguide section (5), provisions for water cooling connections (6), and a liquid cooling channel (7).

Figure 8:
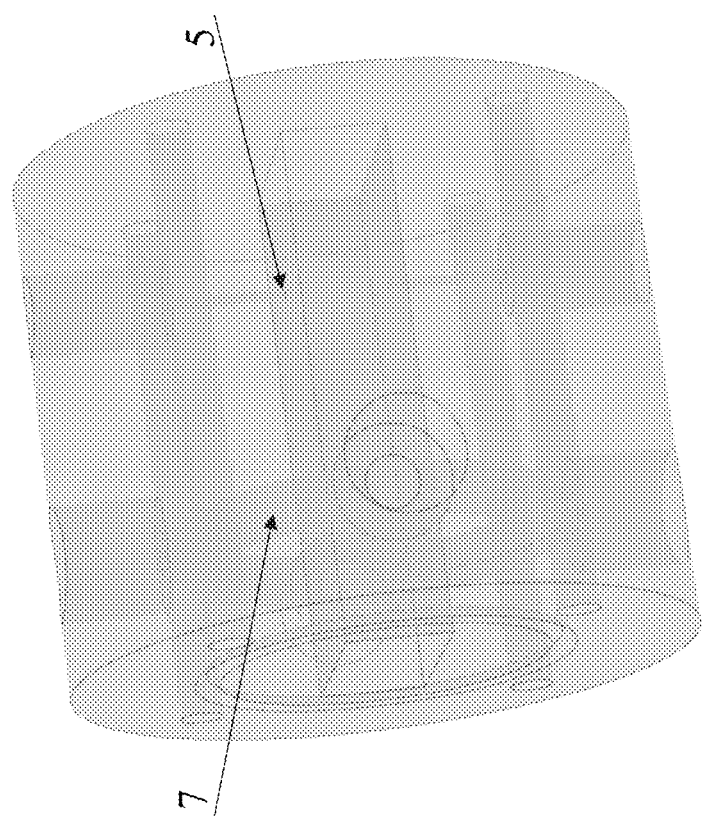
FIG. 8 is an isometric, transparent side view of a vacuum/pressure cooling component of a waveguide system.

FIG. 8 is an isometric, transparent side view of a vacuum/pressure cooling component of a waveguide system. Such figure depicts a vacuum through hole to the waveguide section (5), and a liquid cooling channel (7).

Figure 9A:
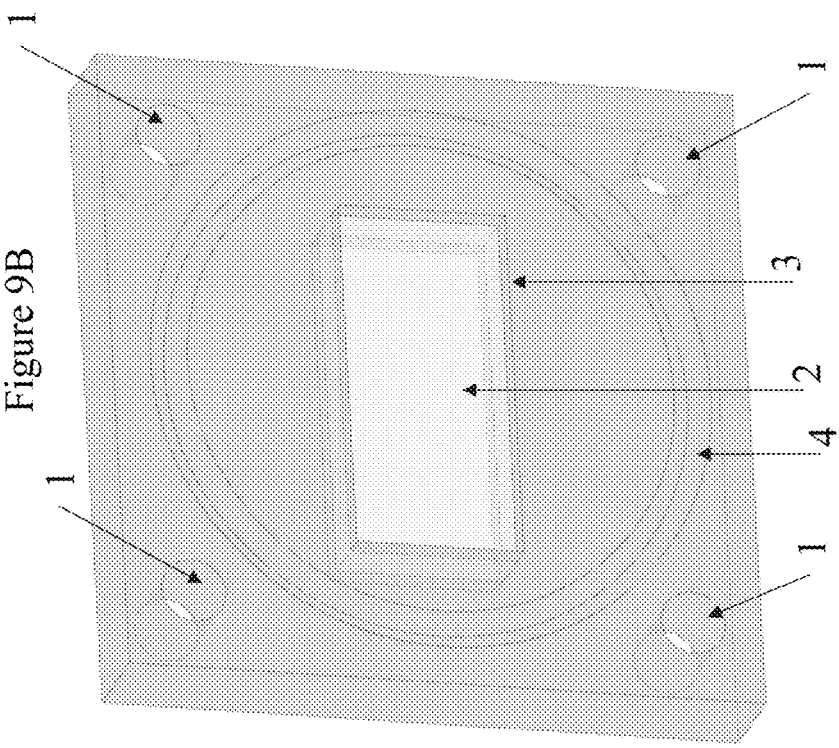
FIG. 9A is an isometric front view of a waveguide vacuum/pressure window component of a waveguide system.

FIG. 9A is an isometric front view of a waveguide vacuum/pressure window component of a waveguide system. Such figure depicts provisions for bolts (1), a hermetically sealed window that is transparent to the frequencies of interest (2), a waveguide section (3), and an o-ring grove (4).

Figure 9B:
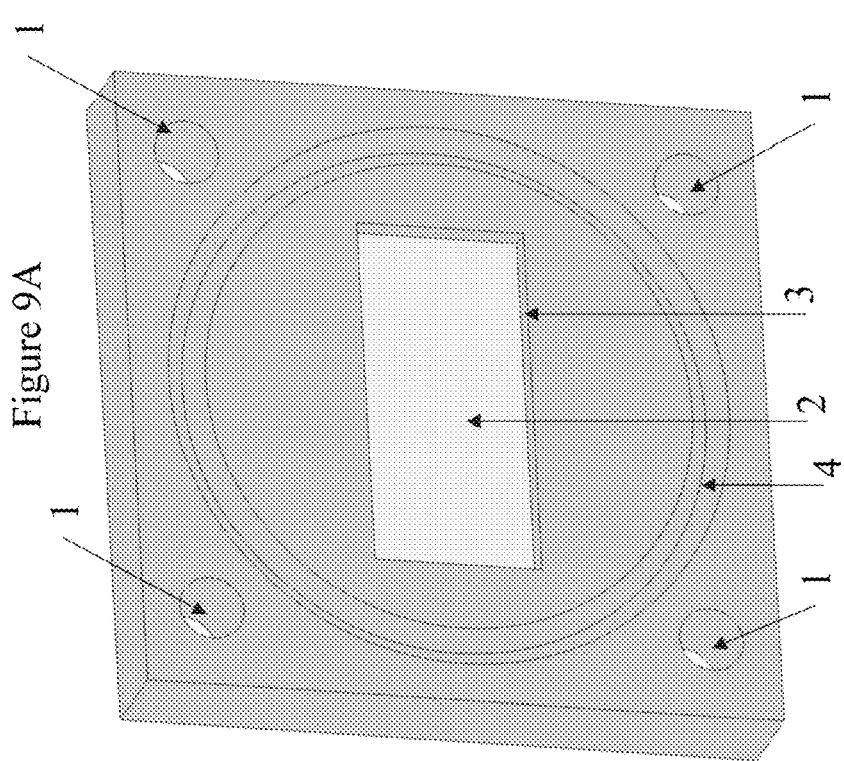
FIG. 9B is an isometric, transparent front view of a waveguide vacuum/pressure window component of a waveguide system.

FIG. 9B is an isometric, transparent front view of a waveguide vacuum/pressure window component of a waveguide system. Such figure depicts provisions for bolts (1), a hermetically sealed window that is transparent to the frequencies of interest (2), a waveguide section (3), and an o-ring grove (4).

Figure 10A:
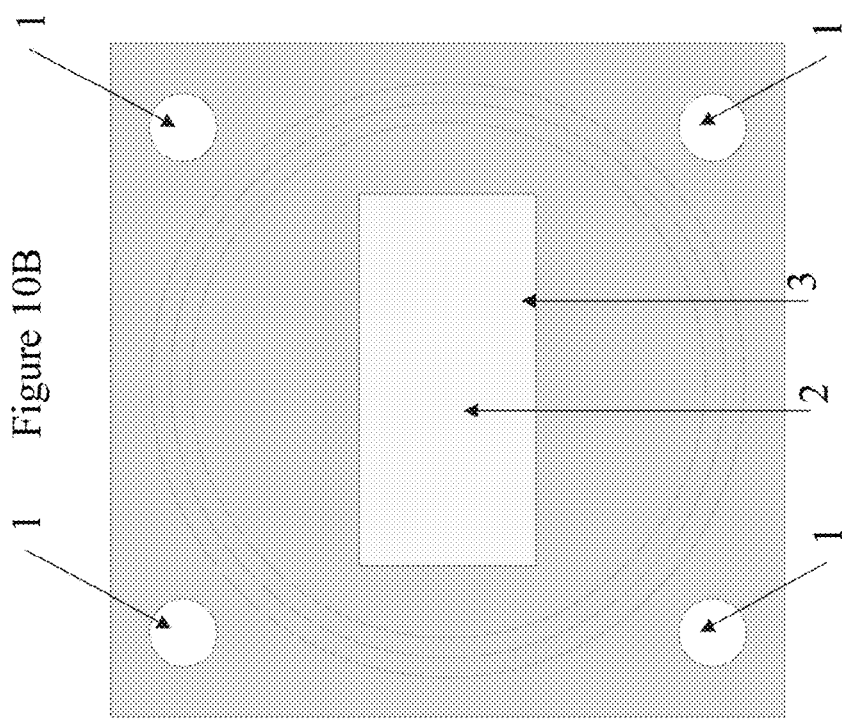
FIG. 10A is a back view of a waveguide vacuum/pressure window component of a waveguide system.

FIG. 10A is a back view of a waveguide vacuum/pressure window component of a waveguide system. Such figure depicts provisions for bolts (1), a hermetically sealed window that is transparent to the frequencies of interest (2), and a waveguide section (3).

Figure 10B:
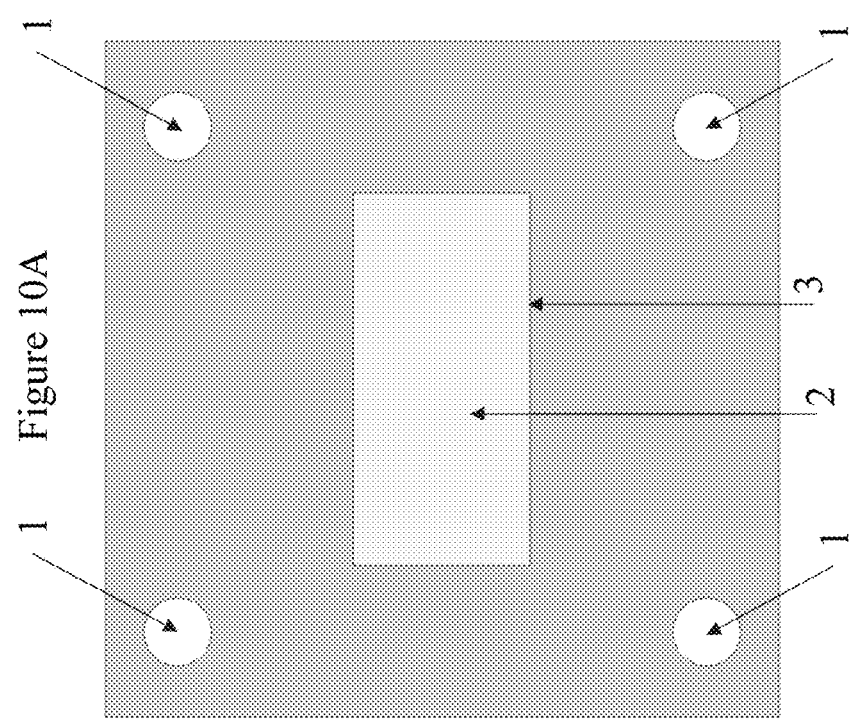
FIG. 10B is a transparent back view of a waveguide vacuum/pressure window component of a waveguide system.

FIG. 10B is a transparent back view of a waveguide vacuum/pressure window component of a waveguide system. Such figure depicts provisions for bolts (1), a hermetically sealed window that is transparent to the frequencies of interest (2), and a waveguide section (3).

Figure 11A:
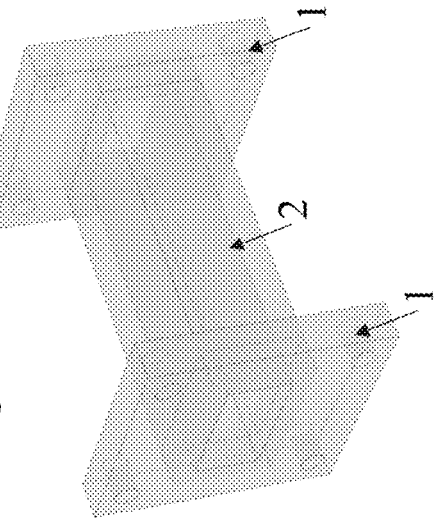
FIG. 11A is an isometric side view of a waveguide straight section component of a waveguide system.

FIG. 11A is an isometric side view of a waveguide straight section component of a waveguide system. Such figure depicts provisions for bolts (1), and a waveguide through hole (2).

Figure 11B:
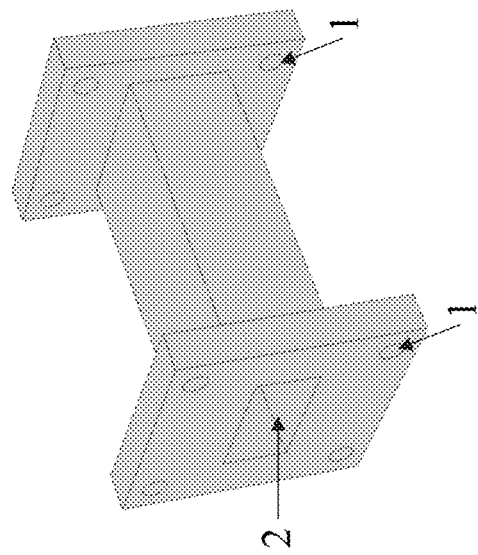
FIG. 11B is a transparent, isometric side view of a waveguide straight section component of a waveguide system.

FIG. 11B is a transparent, isometric side view of a waveguide straight section component of a waveguide system. Such figure depicts provisions for bolts (1), and a waveguide through hole (2).

FIG. 12A is a back view of a waveguide adapter component of waveguide system wherein said waveguide adapter comprises optional slits. Such figure depicts provisions for bolts (1), optional slits (2), and a coaxial connection (3).

FIG. 12B is a transparent back view of a waveguide adapter component of waveguide system wherein said waveguide adapter comprises optional slits. Such figure depicts provisions for bolts (1), optional slits (2), and a coaxial connection (3).

Figure 13A:
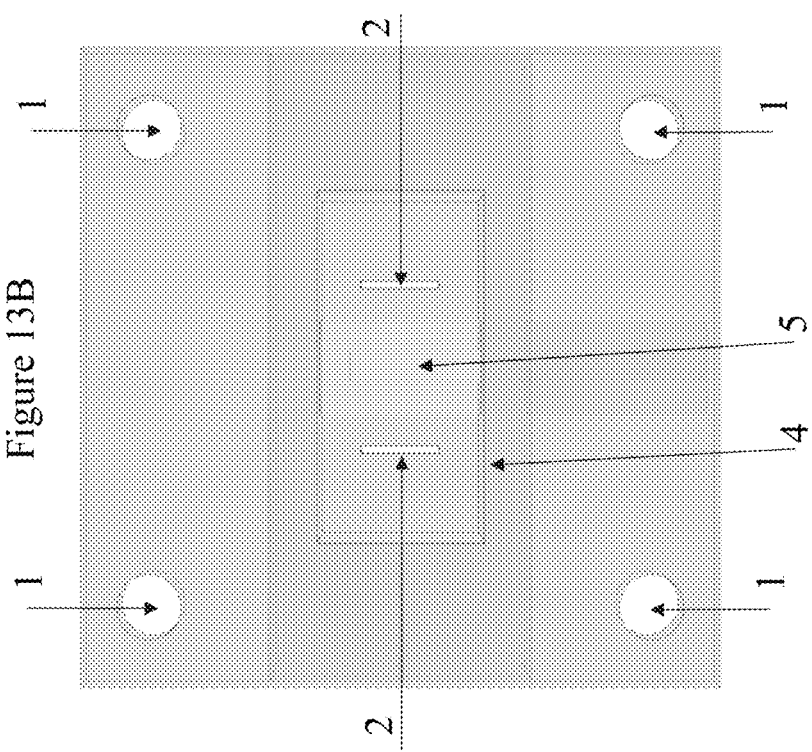
FIG. 13A is a front view of a waveguide adapter component of waveguide system wherein said waveguide adapter comprises optional slits.

FIG. 13A is a front view of a waveguide adapter component of waveguide system wherein said waveguide adapter comprises optional slits. Such figure depicts provisions for bolts (1), optional slits (2), a waveguide section (4), and a waveguide to coaxial transition (5).

Figure 13B:
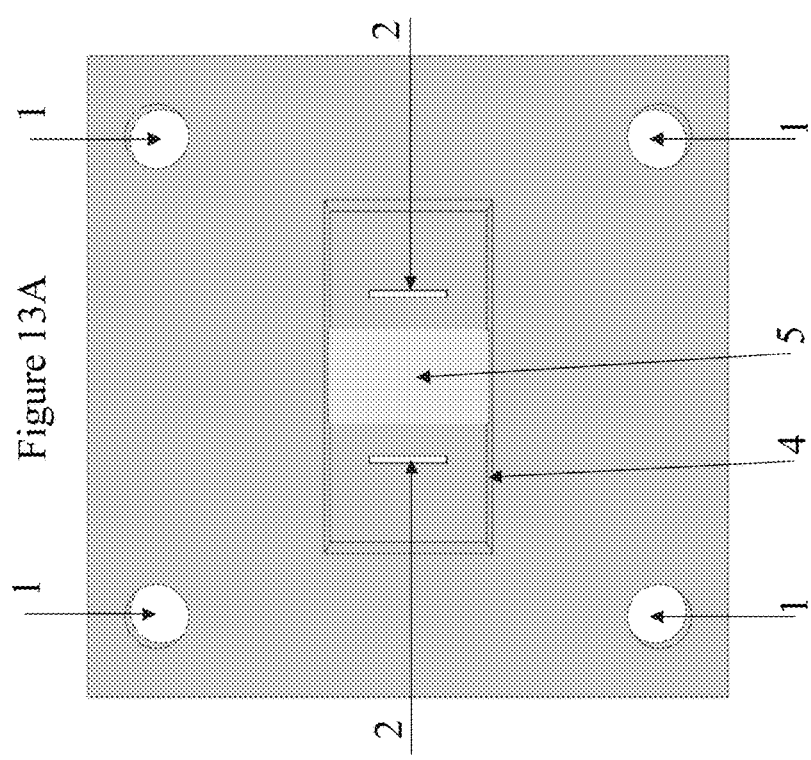
FIG. 13B is a transparent front view of a waveguide adapter component of waveguide system wherein said waveguide adapter comprises optional slits.

FIG. 13B is a transparent front view of a waveguide adapter component of waveguide system wherein said waveguide adapter comprises optional slits. Such figure depicts provisions for bolts (1), optional slits (2), a waveguide section (4), and a waveguide to coaxial transition (5).

Figure 14B:
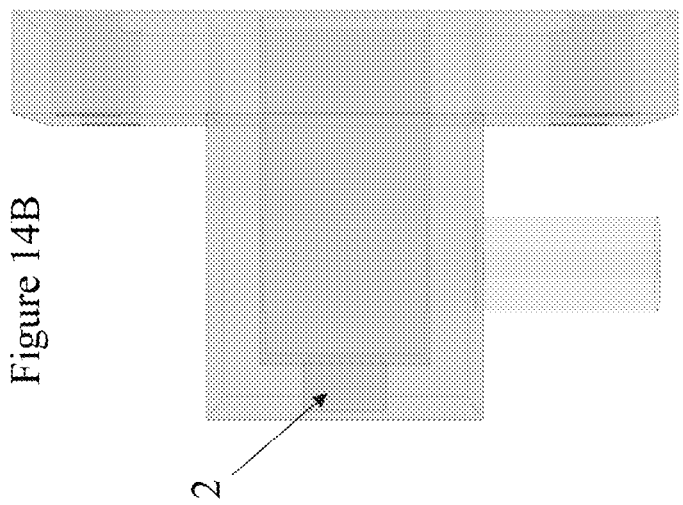
FIG. 14B is a transparent side view of a waveguide adapter component of waveguide system wherein said waveguide adapter comprises optional slits.
Figure 14A:
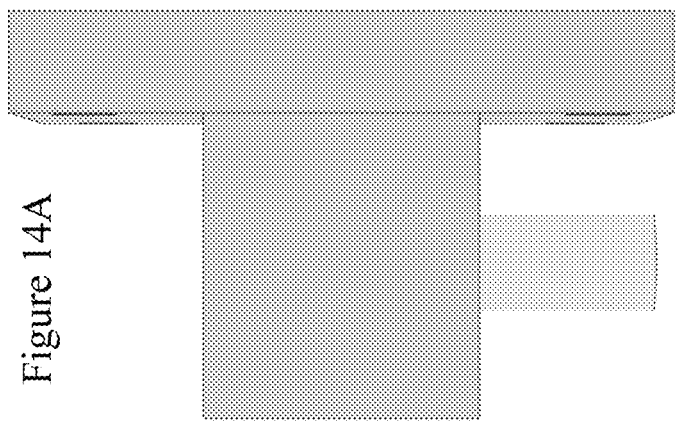
FIG. 14A is a side view of a waveguide adapter component of waveguide system wherein said waveguide adapter comprises optional slits.

FIG. 14A is a side view of a waveguide adapter component of waveguide system wherein said waveguide adapter comprises optional slits.

FIG. 14B is a transparent side view of a waveguide adapter component of waveguide system wherein said waveguide adapter comprises optional slits. Such figure depicts optional slits (2).

Waveguide System

For purposes of this specification, headings are not considered paragraphs and thus this paragraph is paragraph sixty-four of the present specification. The individual number of each paragraph above and below this paragraph can be determined by reference to this paragraph's number. In this paragraph sixty-four, Applicants disclose a waveguide system comprising:
 a) first and second waveguide adapters each having a first and second end;
 b) first and second straight wave guides each having a first and second end and a waveguide through hole;
 c) first and second vacuum or high pressure waveguide windows each having a first and second end;
 d) first, second, third and fourth gaskets;
 e) first and second vacuum or pressure cooling components each having a first and second end, a waveguide through hole, a plurality of optional vacuum fittings, one or more optional vacuum through holes to the waveguide through hole, a plurality of optional water cooling connections and one or more optional liquid cooling channels;
 f) high temperature waveguide having a first and second end, an exterior surface and a waveguide through hole; and
 g) one or more optional heaters;
said first waveguide adapter being removably connected at said first waveguide adapter's second end to said first straight wave guide's first end;
said first straight wave guide being removably connected at said first straight wave guide's second end to said first vacuum or high pressure waveguide window's first end;
said first vacuum or high pressure waveguide window being removably connected at said first vacuum or high pressure waveguide window's second end to said first vacuum or pressure cooling component's first end, said first gasket being disposed within said connection;
said first vacuum or pressure cooling component being removably connected at said first vacuum or pressure cooling component's second end to said high temperature waveguide's first end, said second gasket being disposed within said connection; said second waveguide adapter being removably connected at said second waveguide adapter's second end to said second straight wave guide's first end;
said second straight wave guide being removably connected at said second straight wave guide's second end to said second vacuum or high pressure waveguide window's first end; said second vacuum or high pressure waveguide window being removably connected at said second vacuum or high pressure waveguide window's second end to said second vacuum or pressure cooling component's first end, said third gasket being disposed within said connection;
said second vacuum or pressure cooling component being removably connected at said first vacuum or pressure cooling component's second end to said high temperature waveguide's second end, said fourth gasket being disposed within said connection; said one or more optional heaters being disposed around the exterior surface of said high temperature waveguide.

Applicants disclose the waveguide system of paragraph sixty-four wherein;
 a) said first, second, third and fourth gaskets are o-rings;
 b) said second ends of said first and second vacuum or high pressure waveguide windows comprise an o-ring groove;
 c) said first and second ends of said first and second vacuum or pressure cooling components comprise an o-ring groove
 d) said first and second ends of said high temperature waveguide comprise an o-ring groove;
said first o-ring gasket is disposed in the grooves of the second end of said first vacuum or high pressure waveguide window and the first end of said first vacuum or pressure cooling component;
said second o-ring gasket is disposed in the grooves of the second end of said first vacuum or pressure cooling component and said first end of said high temperature waveguide;
said third o-ring gasket is disposed in the grooves of the second end of said second vacuum or pressure cooling component and said second end of said high temperature waveguide;
said fourth o-ring gasket is disposed in the grooves of the second end of said second vacuum or high pressure waveguide window and the first end of said second vacuum or pressure cooling component.

Applicants disclose the waveguide system of paragraphs sixty-four through sixty-five wherein at least one of said removable connections comprises a plurality of threaded fasteners.

Applicants disclose the waveguide system of paragraphs sixty-four through sixty-six wherein each removable connection comprises a plurality of threaded fasteners.

Applicants disclose the waveguide system of paragraphs sixty-four through sixty-seven wherein at least one waveguide adapter comprises a slit.

Applicants disclose the waveguide system of paragraphs sixty-four through sixty-eight comprising one or more heaters, preferably said waveguide system comprises an induction heater, a radiative heater and/or a furnace heater, preferably each of said heaters is independently a radiative heater and/or an induction heater, more preferably each of said heaters is an induction heater.

Applicants disclose the waveguide system of paragraphs sixty-four through sixty-nine wherein each of said threaded fasteners are independently selected from the group consisting of bolts and/or studs, preferably each of said threaded fasteners is a bolt.

Applicants disclose the waveguide system of paragraphs sixty-four through seventy wherein said first and second vacuum or pressure cooling components comprise a plurality of vacuum fittings, a vacuum through hole to the waveguide through hole, a plurality of water cooling connections and a liquid cooling channel, preferably said first and second vacuum or pressure cooling components comprise at least 8 fittings or from to 8 to 14 vacuum fittings, a vacuum through hole to the waveguide through hole, at least 22 water cooling connections or from 22 to 30 water cooling connections and a liquid cooling channel.

Applicants disclose the waveguide system of paragraphs sixty-four through seventy-one wherein said high temperature waveguide comprises a refractory metal and an oxidation protective coating; preferably said refractory metal is selected from the group consisting of molybdenum and molybdenum alloys, more preferably said refractory metal is a molybdenum alloy, most preferably said refractory metal is Titanium-Zirconium-Molybdenum alloy, and preferably said oxidation protective coating is a Silicon/Boron/Carbon oxidation protective coating, preferably said Silicon/Boron/Carbon oxidation protective coating has an atomic ratio of Silicon/Boron/Carbon that is 1:10:2. A suitable Silicon/Boron/Carbon oxidation protective coating has an atomic ratio of Silicon/Boron/Carbon that is 1:10:2 is SIBOR®. Plansee SE located at Metallwerk-Plansee-Str. Reutte, Austria 716600 can apply SIBOR® coatings to objects.

Applicants disclose the waveguide system of paragraphs sixty-four through seventy-two wherein each waveguide component's waveguide through hole is axial with respect to each waveguide component.

Applicants disclose the waveguide system of paragraphs sixty-four through seventy-three wherein each waveguide component's waveguide through hole is rectangular, square or circular.

Applicants disclose the waveguide system of sixty-four through seventy-four wherein said oxidation protective coating is coated with a ceramic that comprises zirconium oxide.

Diagnostic Device

Applicants disclose a diagnostic device, said device comprising a waveguide system of paragraphs sixty-four through seventy-five.

Applicants disclose the diagnostic device of paragraph seventy-five said diagnostic device comprising a vector network analyzer and a computer.

Narrowband Characterization

A hermetic low-loss impedance matched window is required for narrow band characterization. For example, when considering X-Band frequency, this window typically consists of quartz fixed in a small waveguide section as seen in sheet 10 of the drawings. In addition to the window material, an iris implemented to impedance match the window at a particular frequency. With two impedance matched windows at the same frequency, a sample material can be characterized at a temperature of interest.

Before material characterization can begin, a transmission reflection & line (TRL) calibration must be performed on the vector network analyzer (VNA) at the temperature of interest. This is performed while the waveguide system is assembled. And example of the assembled system is shown on sheet 1 of the drawings.

Referring to FIG. 1A of sheet 1, a waveguide adapter is attached to the left side of the assembled system (Port 1). The reference plane and TRL calibration would take place on the right side (Port 2) either at room temperature or while the waveguide is heated—with no sample inside of it. It is important to note the dimensions of the waveguide heated section and sample will change while it is being heated due to thermal expansion, therefore the effects of this thermal expansion of the waveguide heated section, as well as the sample, must be known to correctly extract the materials parameters of complex permittivity ($\varepsilon_7$) and complex permeability ($\mu_r$) of isotropic samples.

If the coefficient of thermal expansion of the sample is lower than the waveguide when the sample fully fills the waveguide at room temperature, then an air gap will form between the heated waveguide section and sample when the waveguide heated section is heated. When air gaps are present, an air gap correction must be made, which is explained below. If the coefficient of thermal expansion of the sample is higher than the waveguide, then the sample must be smaller than the waveguide before being heated. For best results, the sample should completely fill the waveguide at the temperature of interest.

After the TRL calibration has taken place, the waveguide should be gradually brought down to room temperature if it was heated. One side should be disassembled, a sample placed directly in the center of the heated waveguide system, and then reassembled. After this is done, the waveguide heated section should be brought up to the temperature of interested and held there until the system reaches thermal equilibrium. After this, S parameters should be recorded using the TRL calibration of the temperature of interest. These S parameters are noted as $S_{11}{}^c$, $S_{21}{}^c$, $S_{12}{}^c$, $S_{22}{}^c$.

To extract the complex permittivity and complex permeability of the sample material at the temperature of interest, and at the matched frequency of the windows, the following operations must be performed.

First, the averaged $\bar{\beta}_w$ propagation constant of the waveguide must be calculated.

$$\bar{\beta}_w = \sqrt{\left(\frac{\omega}{c}\right)^2 - \left(\frac{\pi}{\bar{L}_a}\right)^2}$$

Here $\omega$ is the angular frequency of the matched frequency of the window, c is the speed of light in a vacuum, and $\bar{L}_a$ is the average waveguide width of the longest side of its rectangular cross section.

An example of calculating the average waveguide width is given below. This graphic assumes symmetry at the center of the waveguide heated section. The length from the ends of waveguide adapters up to the heated waveguide section would have a length of $z_1$. From the ends of the heated waveguide section, held as close to room temperature as possible using the cooling sections, up to a uniformly heated region of the heated waveguide section, would have a length of $z_2$. The uniformly heated section would have a length of $z_3$. Then the total length of the assembled waveguide minus the coaxial waveguide adapters is given by $$z = 2z_1 + 2z_2 + z_3$$

And the average waveguide width is given by $$\bar{L}_a = L_a(2z_1/z) + (L_a + \Delta L_a/2)(2z_2/z) + (L_a + \Delta L_a)(z_3/z)$$

With the average propagation constant ($\bar{\beta}_w$) known, we can proceed to process the calibrated S-parameters by de-embedding them to the face of the sample. It is assumed that port 1 is on the left-hand side and port 2 is on the right-hand side. Referring to FIG. 1A of sheet one in the drawings, if the calibration plane is at port 2 or right-hand side of the assembled system, to de-embed the S-parameter from the calibrated measurement to the face of the perfectly centered sample, the following must be done.

$$S_{11}{}^s = S_{11}{}^c e^{j\bar{\beta}_w(d+\Delta)}$$

$$S_{21}{}^s = S_{21}{}^c e^{-j\bar{\beta}_w \Delta}$$

$$S_{12}{}^s = S_{12}{}^c e^{-j\bar{\beta}_w \Delta}$$

$$S_{22}{}^s = S_{22}{}^c e^{-j2\bar{\beta}_w \Delta}$$

If the calibration plane is at port 1, then the following must be done.

$$S_{11}{}^s = S_{11}{}^c e^{-j2\bar{\beta}_w \Delta}$$

$$S_{21}{}^s = S_{21}{}^c e^{-j\bar{\beta}_w \Delta}$$

$$S_{12}{}^s = S_{12}{}^c e^{-j\bar{\beta}_w \Delta}$$

$$S_{22}{}^s = S_{22}{}^c e^{j\bar{\beta}_w(d+\Delta)}$$

From here, if no gaps exist between the sample and the heated waveguide, relative complex permittivity and complex permeability of the sample can be extracted with the following procedures.

$$V_1 = S_{21}{}^s + S_{11}{}^s$$

$$V_2 = S_{21}{}^s - S_{11}{}^s$$

$$X = (1 - V_1 V_2)/(V_1 - V_2)$$

$$\Gamma = X \pm \sqrt{X^2 - 1}\ (\Gamma < 1)$$

$$P = (V_1 - \Gamma)/(1 - \Gamma V_1)$$

$$\beta_s = (2j\pi n - \ln(P))/jL_s, n = 0,1,2\ldots$$

Here the integer n is chosen to be the number of wavelengths within the sample. For example, if a sample is extremely thin, then n would be chosen to be 0 unless permittivity or permeability were significantly high.

$$\mu_{r(S11\_S21)} = \frac{(1+R)\beta_s}{(1-R)\beta_w}$$

$$\varepsilon_{r(S11\_S21)} = \frac{\beta_s^2 + (\pi/L_a)^2}{\mu_r k_0^2}$$

The process is again repeated except $V_1$ and $V_2$ are defined from the de-embedded $S_{12}$ and $S_{22}$ taken from the VNA.

$$V_1 = S_{12}^s + S_{22}^s$$

$$V_2 = S_{12}^s - S_{22}^s$$

$$\mu_{r(S22\_S12)} = \frac{(1+R)\beta_s}{(1-R)\beta_w}$$

-continued $$\varepsilon_{r(S22\_S12)} = \frac{\beta_s^2 + (\pi/L_a)^2}{\mu_r k_0^2}$$

The extracted values of $\mu_r$ and $\varepsilon_r$ are then averaged to give $$\mu_r = [\mu_{r(S22\_S12)} + \mu_{r(S22\_S12)}]/2$$

$$\varepsilon_r = [\varepsilon_{r(S22\_S12)} + \varepsilon_{r(S11\_S21)}]/2$$

So long as the sample isn't a multiple of a half-guided wavelength and the waveguide is completely filled, the results will be most accurate at the matched frequency of the windows. The results can be even more accurate for non-magnetic materials by assuming relative permeability $\mu_{r(S11\_S21)}$ and $\mu_{r(S22\_S12)}$ are equal to 1.

If air gaps exist between the sample and the waveguide, then an air gap correction must take place. It is important to note that large air gaps will introduce significant error into the measurement for samples with higher values of permittivity and permeability. The air gap must typically be less than 1% of the total height of the sample. The following procedures can be used to correct for air gaps from the previously extracted values of relative complex permittivity and complex permeability.

$$\Delta b = (L_b - L_{bs})/L_b$$

$$\mu_r' = (\mu_r' - \Delta b)/(1 - \Delta b)$$

$$\mu_r'' = \mu_r''/(1 - \Delta b)$$

$$\varepsilon_r' = \varepsilon_r'(1 - \Delta b)/(1 - \Delta b \varepsilon_r')$$

$$\varepsilon_r'' = \varepsilon_r''(1 - \Delta b)/(1 - \Delta b \varepsilon_r'')^2$$

$$\mu_r = \mu_r' + \mu_r''$$

$$\varepsilon_r = \varepsilon_r' + \varepsilon_r''$$

Here $\varepsilon_r'$ and $\mu_r'$ are the real portions of the extracted complex permittivity and permeability while $\varepsilon_r'$ and $\mu_r''$ are the imaginary portions. Finally, complex permittivity and permeability are given by $$\varepsilon = \varepsilon_0 \varepsilon_r$$

$$\mu_r = \mu_0 \mu_r$$

Broadband Characterization

To characterize isotropic materials over the bandwidth of the waveguide, a hermetic window section (sheet 10 of the drawings) which fully fills the waveguide cross section with a low loss material must be used. For example, an X-Band waveguide (8-12 GHz) could utilize a quartz window as it is a low loss material for that frequency range. Unlike the narrowband method, no iris should be present on this window.

To begin the characterization process. First, the complex permittivity and permeability of the window sections, the pressure/cooling sections, and the heated waveguide sections must be known. These parameters can be extracted using a simpler form of the narrowband method described above and a different TRL calibration method. A TLR calibration method is only required at room temperature for characterizing the window section and the pressure/cooling sections. This calibration is performed by using only the waveguide adapters. After the calibration is performed, S-parameters of the window section and pressure/cooling section are acquired by using only the waveguide adapters and the section of interest, one at a time.

Because the waveguide adapters are used directly on each section, no de-embedding is required and the S-parameters translate directly to the surface of the section being measured, given below.

$$S_{11}{}^s = S_{11}{}^c$$

$$S_{21}{}^s = S_{21}{}^c$$

$$S_{12}{}^s = S_{12}{}^c$$

$$S_{22}{}^s = S_{22}{}^c$$

Using these parameters, the complex permittivity and permeability of each section can be extracted using the methods described in narrowband characterization section. These components are likely to have a real relative permeability of 1 with no imaginary component. Furthermore, no air gap correction is needed.

After this is performed, the waveguide system needs to be assembled with no sample inside of it. The next step is to characterize the heated waveguide section's permittivity and permeability as a function of temperature. Referring to FIG. 1A, each waveguide section, not including the waveguide adapters, has the following lengths $\Delta z_{(1)}$=left waveguide section length (FIG. 11A Sheet 11)
$\Delta z_{(2)}$=left window section length (Sheet 10)
$\Delta z_{(3)}$=left pressure/cooling section length (FIG. 5A Sheet 5)
$\Delta z_{(4)}$=heated waveguide section (FIG. 4A Sheet 4)
$\Delta z_{(5)}$=right pressure/cooling section length (FIG. 5A Sheet 5)
$\Delta z_{(6)}$=right window section length (Sheet 10)
$\Delta z_{(7)}$=right waveguide section length (FIG. 11A Sheet 11)

Their corresponding relative complex permittivity ($\varepsilon_r$) and permeability are given as ($\mu_r$)

$\varepsilon_{r(1)}$, $\mu_{r(1)}$=1 for the left waveguide section length (FIG. 11A Sheet 11)
$\varepsilon_{r(2)}$, $\mu_{r(2)}$=characterized values for the left window section length (Sheet 10)
$\varepsilon_{r(3)}$, $\mu_{r(3)}$=characterized values for the left pressure/cooling section length (FIG. 5A Sheet 5)
$\varepsilon_{r(4)}$, $\mu_{r(4)}$=1 for the heated waveguide section (FIG. 4A Sheet 4)
$\varepsilon_{r(5)}$, $\mu_{r(5)}$=characterized values for the left pressure/cooling section length (FIG. 5A Sheet 5)
$\varepsilon_{r(6)}$, $\mu_{r(6)}$=characterized values for the left window section length (Sheet 10)
$\varepsilon_{r(7)}$, $\mu_{r(7)}$=1 for the left waveguide section length (FIG. 11A Sheet 11)

The waveguide adapter has a propagation constant of.

$$\beta_{(0)} = \sqrt{\left(\frac{\omega}{c}\right)^2 - \left(\frac{\pi}{L_a}\right)^2}$$

Notice this is not an average waveguide propagation constant as there is no thermal expansion in this section. The left and rightmost waveguide sections also have the same propagation constant.

$$\beta_{(0)} = \beta_{(1)} = \beta_{(7)}$$

Here $\beta_0$ represent the propagation constant at a waveguide adapter to the left of the assembled system. $\beta_1$ and $\beta_7$ represent the propagation constants in the waveguide sections at the left and right ends of the assembled system.

In the window section, the cooling/pressure section, and the heated waveguide sections have propagation constants given by $$\beta_{(i)} = \sqrt{k_0{}^2 \varepsilon_{r(i)} \mu_{r(i)} - k_w{}^2} \text{ for } i=2,3,4,5,6$$

Where $\varepsilon_{r2}$ and $\mu_{r2}$ are the extracted relative complex permittivity and complex permeability of the window section, respectively. The same is true for $\varepsilon_{r6}$ and $\mu_{r6}$. In the same manner $\varepsilon_{r3}$ and $\mu_{r3}$ are the relative complex permittivity and complex permeability of the pressure/window section, respectively. The same is true for $\varepsilon_{r5}$ and $\mu_{r5}$.

Finally, the heated waveguide section's values ($\varepsilon_{r(4)}$ and $\mu_{r(4)}$) over different temperatures will need to be found using a root-finding algorithm, such as the Newton-Raphson method. The purely real values of 1 is a good starting guess value for $\varepsilon_{r(4)}$ and $\mu_{r(4)}$. This value will change and converge to a value as the root finding algorithm proceeds.

The next steps are to construct a matrix with these initial values to be used in a root finding algorithm. First, admittance numbers are constructed for each section and the waveguide adapter $$A_{(i)} = \beta_{(i)}/(k_0 \eta_0) \text{ for } i=0,1,2,3,4,5,6,7$$

Where the free space impedance $\eta_0$ is given by $$\eta_0 = \sqrt{\mu_0/\varepsilon_0}$$

$$\varepsilon_0 = 8.8541878128 \times 10^{-12}$$

$$\mu_0 = 1.25663706212 \times 10^{-6}$$

The admittance matrix M is then constructed using phase information from the propagation constants $$\Psi_i = \beta_{(i)} \Delta z_{(i)} \text{ for } i=0,1,2,3,4,5,6,$$

The following constants are then generated.

$$C_0 = \beta_0 - i \cot(\beta_1) \Delta z_0 A_0$$

$$C_1 = i \csc(\beta_1) \Delta z_0 A_0$$

$$C_2 = i A_1 \csc(\Psi_1)$$

$$C_3 = -i[A_1 \cot(\Psi_1) + A_2 \cot(\Psi_2)]$$

$$C_4 = C_5 = i A_2 \csc(\Psi_2)$$

$$C_6 = -i[A_2 \cot(\Psi_2) + A_3 \cot(\Psi_3)]$$

$$C_7 = C_8 = i A_3 \csc(\Psi_3)$$

$$C_9 = -i[A_3 \cot(\Psi_3) + A_4 \cot(\Psi_4)]$$

$$C_{10} = C_{11} = i A_4 \csc(\Psi_4)$$

$$C_{12} = -i[A_4 \cot(\Psi_4) + A_5 \cot(\Psi_5)]$$

$$C_{13} = C_{14} = i A_5 \csc(\Psi_5)$$

$$C_{15} = -i[A_5 \cot(\Psi_5) + A_6 \cot(\Psi_6)]$$

$$C_{16} = C_{17} = i A_6 \csc(\Psi_6)$$

$$C_{18} = -i[A_6 \cot(\Psi_6) + A_7 \cot(\Psi_7)]$$

$$C_{19} = i A_7 \csc(\Psi_7)$$

With these values the admittance matrix takes the form.

$$M = \begin{bmatrix} C_0 & C_1 & 0 & 0 & 0 & 0 & 0 & 0 \\ C_2 & C_3 & C_4 & 0 & 0 & 0 & 0 & 0 \\ 0 & C_5 & C_6 & C_7 & 0 & 0 & 0 & 0 \\ 0 & 0 & C_8 & C_9 & C_{10} & 0 & 0 & 0 \\ 0 & 0 & 0 & C_{11} & C_{12} & C_{13} & 0 & 0 \\ 0 & 0 & 0 & 0 & C_{14} & C_{15} & C_{16} & 0 \\ 0 & 0 & 0 & 0 & 0 & C_{17} & C_{18} & C_{19} \\ 0 & 0 & 0 & 0 & 0 & 0 & C_1 & C_0 \end{bmatrix}$$

The admittance matrix is then inverted and multiplied by T to obtain theoretical S parameters.

$$T = \begin{bmatrix} A_0 \\ 0 \\ 0 \\ 0 \\ 0 \\ 0 \\ 0 \\ 0 \end{bmatrix}$$

$$P = M^{-1} T$$

$$S_{11\_Theoretical} = P_{[1,1]} - 1$$

$$S_{21\_Theoretical} = P_{[8,1]}$$

The theoretical S-parameters are then compared to the measured S-parameters of the VNA, and the function (F1) needs to be minimized through iteration. This is done by changing the values of $\varepsilon_{r(4)}$ and $\mu_{r(4)}$ through each iteration.

$$F1 = (\text{Re}(S_{11\_Theoretical} - S_{11\_Measured}))^2 + (\text{Im}(S_{11\_Theoretical} - S_{11\_Measured}))^2 + (\text{Re}(S_{21\_Theoretical} - S_{21\_Measured}))^2 + (\text{Im}(S_{21\_Theoretical} - S_{21\_Measured}))^2$$

The $S_{22}$ and $S_{12}$ parameters can also be compared by rearranging the M matrix as follows.

$$M = \begin{bmatrix} C_0 & C_1 & 0 & 0 & 0 & 0 & 0 & 0 \\ C_{19} & C_{18} & C_{17} & 0 & 0 & 0 & 0 & 0 \\ 0 & C_{16} & C_{15} & C_{14} & 0 & 0 & 0 & 0 \\ 0 & 0 & C_{13} & C_{12} & C_{11} & 0 & 0 & 0 \\ 0 & 0 & 0 & C_{10} & C_9 & C_8 & 0 & 0 \\ 0 & 0 & 0 & 0 & C_7 & C_6 & C_5 & 0 \\ 0 & 0 & 0 & 0 & 0 & C_4 & C_3 & C_2 \\ 0 & 0 & 0 & 0 & 0 & 0 & C_1 & C_0 \end{bmatrix}$$

$$S_{22\_Theoretical} = P_{[1,1]} - 1$$

$$S_{12\_Theoretical} = P_{[8,1]}$$

Using the same methods to obtain $$F2 = (\text{Re}(S_{22\_Theoretical} - S_{22\_Measured}))^2 + (\text{Im}(S_{22\_Theoretical} - S_{22\_Measured}))^2 (\text{Re}(S_{12\_Theoretical} - S_{12\_Measured}))^2 + (\text{Im}(S_{12\_Theoretical} - S_{12\_Measured}))^2$$

The value of $\varepsilon_{r(4)}$ and $\mu_{r(4)}$ associated with F1 and the values of $\varepsilon_{r(4)}$ and $\mu_{r(4)}$ associated with F2 can then be averaged.

$$\varepsilon_{r(4)} = (\varepsilon_{r(4,F1)} + \varepsilon_{r(4,F2)})/2$$

$$\mu_{r(4)} = (\mu_{r(4,F1)} + \mu_{r(4,F2)})/2$$

From here the values of $\varepsilon_{r(4)}$ and $\mu_{r(4)}$ at a particular temperature have been characterized and can now be used in a similar process to extract complex permittivity and complex permeability of a sample placed directly in the center of the heated waveguide.

Once again, an admittance matrix must be assembled which will be a 10 by 10 matrix as the sample placed directly in the center of heated waveguide section will divide it into a left side and a right side. Then the lengths will be given as:

$\Delta z_{(1)}$=left waveguide section length (FIG. 11A Sheet 11)
$\Delta z_{(2)}$=left window section length (Sheet 10)
$\Delta z_{(3)}$=left pressure/cooling section length (FIG. 5A Sheet 5)
$\Delta z_{(4)}$=left heated waveguide section length
$\Delta z_{(5)}$=sample section length
$\Delta z_{(6)}$=right heated waveguide section length
$\Delta z_{(7)}$=right pressure/cooling section length (FIG. 5A Sheet 5)
$\Delta z_{(8)}$=right window section length (Sheet 10)
$\Delta z_{(9)}$=right waveguide section length (FIG. 11A Sheet 11)

The left ($\Delta z_{(4)}$) and right ($\Delta z_{(6)}$) heated waveguide section lengths will be equal if the sample is placed directly in the middle of the heated waveguide sections. Their lengths will be half of the total heated waveguide section length minus the sample length.

Each section's corresponding relative complex permittivity ($\varepsilon_r$) and permeability are given as ($\mu_r$)

$\varepsilon_{r(1)}$, $\mu_{r(1)}$=1 for the left waveguide section length (FIG. 11A Sheet 11)
$\varepsilon_{r(2)}$, $\mu_{r(2)}$=characterized values for the left window section length (Sheet 10)
$\varepsilon_{r(3)}$, $\mu_{r(3)}$=characterized values for the left pressure/cooling section length (FIG. 5A Sheet 5)
$\varepsilon_{r(4)}$, $\mu_{r(4)}$=characterized values for the right heated waveguide section (FIG. 4A Sheet 4)
$\varepsilon_{r(5)}$, $\mu_{r(5)}$=guessed value for the sample section (FIG. 4A Sheet 4)
$\varepsilon_{r(6)}$, $\mu_{r(6)}$=characterized values for the left heated waveguide section (FIG. 4A Sheet 4)
$\varepsilon_{r(7)}$, $\mu_{r(7)}$=characterized values for the left pressure/cooling section length (FIG. 5A Sheet 5)
$\varepsilon_{r(8)}$, $\mu_{r(8)}$=characterized values for the left window section length (Sheet 10)
$\varepsilon_{r(9)}$, $\mu_{r(9)}$=1 for the left waveguide section length (FIG. 11A Sheet 11)

Notice the sections containing $\varepsilon_{r(2)}$, $\varepsilon_{r(3)}$, $\varepsilon_{r(4)}$, $\varepsilon_{r(6)}$, $\varepsilon_{r(7)}$, $\varepsilon_{r(8)}$ and $\mu_{r(2)}$, $\mu_{r(3)}$, $\mu_{r(4)}$, $\mu_{r(6)}$, $\mu_{r(7)}$, $\mu_{r(8)}$ were already previously characterized in prior steps. Again, the waveguide adapter has a propagation constant of $$\beta_{(0)} = \sqrt{\left(\frac{\omega}{c}\right)^2 - \left(\frac{\pi}{L_a}\right)^2}$$

The left and rightmost waveguide sections also have the same propagation constant.

$$\beta_{(0)} = \beta_{(1)} = \beta_{(9)}$$

And all other sections the propagation constant is given by $$\beta_{(i)} = \sqrt{k_0^2 \varepsilon_{r(i)} \mu_{r(i)} - k_w^2} \text{ for } i=2,3,4,5,6,7,8$$

The sample section's values ($\varepsilon_{r(5)}$ and $\mu_{r(5)}$) over different temperatures will need to be guessed to be used in a root-finding algorithm. A value found using the narrowband method, at a particular temperature, is a good starting guess for these values.

The admittance matrix M is then constructed using phase information from the propagation constants $\Psi_i = \beta_{(i)} \Delta z_{(i)}$ for $i=0,1,2,3,4,5,6,7,8,9$ $C_0 = \beta_0 - i \cot(\beta_1) \Delta z_0 A_0$ $C_1 = i \csc(\beta_1) \Delta z_0 A_0$ $C_2 = i A_1 \csc(\Psi_1)$ $C_3 = -i[A_1 \cot(\Psi_1) + A_2 \cot(\Psi_2)]$ $C_4 = C_5 = i A_2 \csc(\Psi_2)$ $C_6 = -i[A_2 \cot(\Psi_2) + A_3 \cot(\Psi_3)]$ $C_7 = C_8 = i A_3 \csc(\Psi_3)$ $C_9 = -i[A_3 \cot(\Psi_3) + A_4 \cot(\Psi_4)]$ $C_{10} = C_{11} = i A_4 \csc(\Psi_4)$ $C_{12} = -i[A_4 \cot(\Psi_4) + A_5 \cot(\Psi_5)]$ $C_{13} = C_{14} = i A_5 \csc(\Psi_5)$ $C_{15} = -i[A_5 \cot(\Psi_5) + A_6 \cot(\Psi_6)]$ $C_{16} = C_{17} = i A_6 \csc(\Psi_6)$ $C_{18} = -i[A_6 \cot(\Psi_6) + A_7 \cot(\Psi_7)]$ $C_{19} = C_{20} = i A_7 \csc(\Psi_7)$ $C_{21} = -i[A_6 \cot(\Psi_7) + A_7 \cot(\Psi_8)]$ $C_{22} = C_{23} = i A_7 \csc(\Psi_8)$ $C_{24} = -i[A_6 \cot(\Psi_8) + A_7 \cot(\Psi_9)]$ $C_{25} = i A_7 \csc(\Psi_9)$ Which can be used to find theoretical S-parameters using $$M = \begin{bmatrix} C_0 & C_1 & 0 & 0 & 0 & 0 & 0 & 0 & 0 & 0 \\ C_2 & C_3 & C_4 & 0 & 0 & 0 & 0 & 0 & 0 & 0 \\ 0 & C_5 & C_6 & C_7 & 0 & 0 & 0 & 0 & 0 & 0 \\ 0 & 0 & C_8 & C_9 & C_{10} & 0 & 0 & 0 & 0 & 0 \\ 0 & 0 & 0 & C_{11} & C_{12} & C_{13} & 0 & 0 & 0 & 0 \\ 0 & 0 & 0 & 0 & C_{14} & C_{15} & C_{16} & 0 & 0 & 0 \\ 0 & 0 & 0 & 0 & 0 & C_{17} & C_{18} & C_{19} & 0 & 0 \\ 0 & 0 & 0 & 0 & 0 & 0 & C_{20} & C_{21} & C_{22} & 0 \\ 0 & 0 & 0 & 0 & 0 & 0 & 0 & C_{23} & C_{24} & C_{25} \\ 0 & 0 & 0 & 0 & 0 & 0 & 0 & 0 & C_1 & C_0 \end{bmatrix}$$

$$T = \begin{bmatrix} A_0 \\ 0 \\ 0 \\ 0 \\ 0 \\ 0 \\ 0 \\ 0 \\ 0 \\ 0 \end{bmatrix}$$

$P = M^{-1} T$ $S_{11\_Theoretical} = P_{[1,1]} - 1$ $S_{21\_Theoretical} = P_{[10,1]}$ And again $$M = \begin{bmatrix} C_0 & C_1 & 0 & 0 & 0 & 0 & 0 & 0 & 0 & 0 \\ C_{25} & C_{24} & C_{23} & 0 & 0 & 0 & 0 & 0 & 0 & 0 \\ 0 & C_{22} & C_{21} & C_{20} & 0 & 0 & 0 & 0 & 0 & 0 \\ 0 & 0 & C_{19} & C_{18} & C_{17} & 0 & 0 & 0 & 0 & 0 \\ 0 & 0 & 0 & C_{16} & C_{15} & C_{14} & 0 & 0 & 0 & 0 \\ 0 & 0 & 0 & 0 & C_{13} & C_{12} & C_{11} & 0 & 0 & 0 \\ 0 & 0 & 0 & 0 & 0 & C_{10} & C_9 & C_8 & 0 & 0 \\ 0 & 0 & 0 & 0 & 0 & 0 & C_7 & C_6 & C_5 & 0 \\ 0 & 0 & 0 & 0 & 0 & 0 & 0 & C_4 & C_3 & C_2 \\ 0 & 0 & 0 & 0 & 0 & 0 & 0 & 0 & C_1 & C_0 \end{bmatrix}$$

For $S_{22\_Theoretical} = P_{[1,1]} - 1$ $S_{12\_Theoretical} = P_{[10,1]}$

For $S_{22\_Theoretical} = P_{[1,1]} - 1$ $S_{12\_Theoretical} = P_{[10,1]}$

Then again, the theoretical S-parameters are then compared to the measured S-parameters of the VNA, and the function (F) needs to be minimized through iteration. This is done by changing the values of $\varepsilon_{r(6)}$ and $\mu_{r(6)}$ through each iteration.

$F1 = (\text{Re}(S_{11\_Theoretical} - S_{11\_Measured}))^2 + (\text{Im}(S_{11\_Theoretical} - S_{11\_Measured}))^2 + (\text{Re}(S_{21\_Theoretical} - S_{21\_Measured}))^2 + (\text{Im}(S_{21\_Theoretical} - S_{21\_Measured}))^2$ $F2 = (\text{Re}(S_{22\_Theoretical} - S_{22\_Measured}))^2 + (\text{Im}(S_{22\_Theoretical} - S_{22\_Measured}))^2 + (\text{Re}(S_{12\_Theoretical} - S_{12\_Measured}))^2 + (\text{Im}(S_{12\_Theoretical} - S_{12\_Measured}))^2$ The value of $\varepsilon_{r(6)}$ and $\mu_{r(6)}$ associated with F1 and the values of $\varepsilon_{r(6)}$ and $\mu_{r(6)}$ associated with F2 can then be averaged.

$\varepsilon_{r(4)} = (\varepsilon_{r(6,F1)} + \varepsilon_{r(6,F2)})/2$ $\mu_{r(4)} = (\mu_{r(6,F1)} + \mu_{r(6,F2)})/2$ Finally, if an air gap is present, these values can then be used in the air gap correction method as outlined in the narrowband section.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1. The experimental apparatus consists of several components as seen in FIG. 1. Some of these components require capabilities provided by other systems such as a circulating water chiller, pressure controls, and a network analyzer for the characterization process. When the apparatus is fully assembled with a sample material placed at its center, and all of the required capabilities are attached to the respective components, it is possible to extract permittivity and permeability of the sample material while varying frequency, temperature, and pressure. Induction coils spaced around the high-temperature waveguide FIG. 2 will induce time varying electric fields upon the waveguide when the coils are excited with their own time varying electric field. The induced currents ohmically heat the waveguide, raising the temperature of the waveguide environment. If the current in the left and right coils shown in FIG. 2 are equal, uniform heating will be achieved within the system. If current is lower in only one coil, a thermal gradient will be achieved. Depending upon the coil arrangement and excitation, evenly distributed or gradient heating will be applied to a material placed at the center of the waveguide. To avoid catastrophic failure of the outside of the waveguide due to increase oxidation at elevated temperatures, a protective layer is applied to it which can retard or prevent oxidation. For further protection of other components of the entire system, a vacuum/pressure & cooling adapter FIG. 3 is used which provides thermal protection to prevent oxidation to the inside of the waveguide system. The vacuum ports of this adapter allow for a vacuum to be pulled on the inside of the assembled system, or to introduce inert gas, or increase the pressure of the system with an inert gas. Controlling the gas within the waveguide through these methods will prevent or retard oxidation to the inside of the system. Additionally, cooling can be circulated through this adapter. The cooling will prevent heat spread to other components of the entire system in situations where high temperatures are applied. In order to keep the pressure within the system contained, o-rings and a hermetically sealed window FIG. 4 are used. The hermetically sealed window is made from material that is highly transmissive to the electromagnetic frequencies which will be used to characterize the material in the waveguide. Additionally, a window that is transparent in both cutoff frequencies and infrared will allow for infrared diagnostics to be used to characterize surface temperature of a sample placed within the waveguide. The waveguide adapter FIG. 5 provides a means to send and receive electromagnetic radiation through the waveguide when attached to a network analyzer. From these signals, S-parameters are deduced. From the S-parameters waveguide material characterization methods can be applied to deduce electromagnetic properties of the material placed within the waveguide. A waveguide adapter with a thin slit may be used in the system to achieve a line of sight to the surface of the material within the waveguide. Infrared diagnostics may then be able to use this path to characterize surface temperature of the sample material.

Example 2. A brief overview of the characterization process at room temperature will be explained. First, a sample material is placed within a waveguide. Then an electromagnetic wave having a $TE_{10}$ mode is sent through one end of the waveguide. The portion of the wave that passes through the sample is considered to have been transmitted through it. The other portions of the wave that are not transmitted can then either be reflected off the sample or be absorbed by the sample. FIG. 6 show rectangular waveguide modes. The transmitted, absorbed, and reflected portions of the wave are recorded by a network analyzer through what are known as S-parameters. The S-parameters are dependent on how many ports there are in an electrical system. In this waveguide system, there are two ports. One port is the transmitting port, which we will call port 1, while the other is the receiving port which we will call port 2. If port 1 sends a wave and port 2 receives the wave, then the S-parameter Sin is the reflected portion of that send signal. S-parameter $S_{12}$ is the received portion of the wave. Any loses due to absorption are recorded in both $S_{11}$ and $S_{12}$. By reversing the order of the sending and receiving ports, S-parameters $S_{22}$ and $S_{21}$ are obtained. From these 4 S-parameters, the complex permittivity and permeability of a material can be extracted using several algorithms. One well known algorithm is the Nicolson-Ross-Weir (NRW) method. This method is outlined below. First, the wavenumbers of the electromagnetic waves within the waveguide which propagate at the $TE_{10}$ mode ($k_{wg}$) and the wavenumbers of the electromagnetic waves in free space ($k_0$) are solved for. Here a, is the longest waveguide dimension perpendicular to direction between the ports. Frequency (f) and the speed of light (c) are also needed in these calculations.

$$k_{wg} = \pi/a, k_0 = 2\pi f/c$$

With these wavenumbers, the propagation constant ($\beta_{wg}$) inside the empty waveguide is given by the equation below.

$$\beta_{wg} = \sqrt{k_0^2 - (k_{wg})^2}$$

The S-parameters obtained by a network analyzer must then be de-embedded. This process is necessary because the S-parameters need to be moved from the end ports of the waveguide to the faces of the sample material. By knowing the propagation constant within the waveguide as well as the distances from the ports to the sample, the S-parameters can then be de-embedded (Benjamin Reid Crowgey, 2013). In the equations below $j=\sqrt{-1}$.

FIG. 1—De-embedding visual aid.

$$S_{11}' = S_{11} e^{2j\beta_{wg} d_1}$$

$$S_{21}' = S_{21} e^{2j\beta_{wg}(d_1+d_2)}$$

$$S_{22}' = S_{22} e^{2j\beta_{wg} d_2}$$

$$S_{12}' = S_{12} e^{2j\beta_{wg}(d_1+d_2)}$$

After the S-parameters have been de-embedded, algebraic manipulation allows us to solve for the interfacial reflection coefficient ($\Gamma$) and the propagation factor (P).

$$X = \frac{1 + \sqrt{S_{11}'} - \sqrt{S_{21}'}}{2 S_{11}'}$$

$$\Gamma = X \pm \sqrt{X^2 - 1}, \text{ use } |\Gamma| < 1$$

$$P = \frac{S_{21}'}{1 - \Gamma S_{11}'}$$

We then arrive to the propagation constant within the sample material ($\beta_s$). In the equation below n=1 if the sample size is kept under a quarter wavelength. This is experimentally achieved by using small lengths in the dimension of $d_s$ is measured FIG. 7.

$$\beta_s = \frac{-\ln(P) \pm j 2 n \pi}{j d_s}$$

From here complex permittivity ($\varepsilon_r$) and permeability ($\mu_r$) can be extracted at room temperature. Note that these values will be complex since the S-parameters are complex. Additionally, and average can be taken be switching $S_{11}' \to S_{22}'$ and $S_{21}' \to S_{12}'$ in the equations above.

$$\mu_r = \frac{1 + \Gamma \beta_s}{1 - \Gamma \beta_{wg}}, \varepsilon_r = \frac{[\beta_s^2 + k_{wg}^2]}{\mu_r k_0^2}$$

The extracted values of complex $\varepsilon_r$ and $\mu_r$ are only good so long as the sample material completely fills the waveguide.

If any airgaps are introduced, then further calculations must be made which considers these airgaps.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A waveguide system comprising
   a) first and second waveguide adapters each having a first and second end;
   b) first and second straight wave guides each having a first and second end and a waveguide through hole;
   c) first and second vacuum or high pressure waveguide windows each having a first and second end, said second ends of said first and second vacuum or high pressure waveguide windows comprising an o-ring groove;
   d) first, second, third and fourth gaskets, said first, second, third and fourth gaskets are o-rings;
   e) first and second vacuum or pressure cooling components each having a first and second end, said first and second ends of said first and second vacuum or pressure cooling components comprise an o-ring groove, a waveguide through hole, a plurality of optional vacuum fittings, one or more optional vacuum through holes to the waveguide through hole, a plurality of optional water cooling connections and one or more optional liquid cooling channels;
   f) high temperature waveguide having a first and second end, an exterior surface and a waveguide through hole, said first and second ends of said high temperature waveguide comprise an o-ring groove; and
   g) one or more optional heaters;
   said first waveguide adapter being removably connected at said first waveguide adapter's second end to said first straight wave guide's first end;
   said first straight wave guide being removably connected at said first straight wave guide's second end to said first vacuum or high pressure waveguide window's first end;
   said first vacuum or high pressure waveguide window being removably connected at said first vacuum or high pressure waveguide window's second end to said first vacuum or pressure cooling component's first end,
   said first gasket is disposed in the grooves of the second end of said first vacuum or high pressure waveguide window and the first end of said first vacuum or pressure cooling component;
   said first vacuum or pressure cooling component being removably connected at said first vacuum or pressure cooling component's second end to said high temperature waveguide's first end,
   said second gasket is disposed in the grooves of the second end of said first vacuum or pressure cooling component and said first end of said high temperature waveguide;
   said second waveguide adapter being removably connected at said second waveguide adapter's second end to said second straight wave guide's first end;
   said second straight wave guide being removably connected at said second straight wave guide's second end to said second vacuum or high pressure waveguide window's first end;
   said second vacuum or high pressure waveguide window being removably connected at said second vacuum or high pressure waveguide window's second end to said second vacuum or pressure cooling component's first end,
   said third gasket is disposed in the grooves of the second end of said second vacuum or pressure cooling component and said second end of said high temperature waveguide;
   said second vacuum or pressure cooling component being removably connected at said first vacuum or pressure cooling component's second end to said high temperature waveguide's second end,
   said fourth gasket is disposed in the grooves of the second end of said second vacuum or high pressure waveguide window and the first end of said second vacuum or pressure cooling component;
   said one or more optional heaters being disposed around the exterior surface of said high temperature waveguide.

2. The waveguide system of claim 1, wherein at least one of said:
   a) first waveguide adapter's second end and said first straight wave guide's first end;
   b) said first straight wave guide's second end and said first vacuum or high pressure waveguide window's first end;
   c) said first vacuum or high pressure waveguide window's second end and said first vacuum or pressure cooling component's first end;
   d) said first vacuum or pressure cooling component's second end and said high temperature waveguide's first end;
   e) said second waveguide adapter's second end and said second straight wave guide's first end;
   f) said second straight wave guide's second end and said second vacuum or high pressure waveguide window's first end;
   g) said second vacuum or high pressure waveguide window's second end and said second vacuum or pressure cooling component's first end;
   h) said second vacuum or pressure cooling component's second end and said high temperature waveguide's second end;
   is removably connected by hardware that comprises a plurality of threaded fasteners.

3. The waveguide system of claim 1, wherein each of said:
a) first waveguide adapter's second end and said first straight wave guide's first end;
b) said first straight wave guide's second end and said first vacuum or high pressure waveguide window's first end;
c) said first vacuum or high pressure waveguide window's second end and said first vacuum or pressure cooling component's first end;
d) said first vacuum or pressure cooling component's second end and said high temperature waveguide's first end;
e) said second waveguide adapter's second end and said second straight wave guide's first end;
f) said second straight wave guide's second end and said second vacuum or high pressure waveguide window's first end;
g) said second vacuum or high pressure waveguide window's second end and said second vacuum or pressure cooling component's first end;
h) said first vacuum or pressure cooling component's second end and said high temperature waveguide's second end;
is removably connected by hardware that comprises a plurality of threaded fasteners.

4. The waveguide system of claim 1, wherein at least one waveguide adapter comprises a slit.

5. The waveguide system of claim 1, comprising one or more heaters.

6. The waveguide system of claim 5, wherein said one or more heaters comprises an induction heater, a radiative heater and/or a furnace heater.

7. The waveguide system of claim 6, wherein each of said one or more heaters is independently a radiative heater and/or an induction heater.

8. The waveguide system of claim 7, wherein each of said one or more heaters is an induction heater.

9. The waveguide system of claim 2, wherein each of said threaded fasteners are independently selected from the group consisting of bolts and/or studs.

10. The waveguide system of claim 9, wherein each of said threaded fasteners is a bolt.

11. The waveguide system of claim 1, wherein said first and second vacuum/pressure cooling components comprise a plurality of vacuum fittings, a vacuum through hole to the waveguide through hole, a plurality of water cooling connections and a liquid cooling channel.

12. The waveguide system of claim 11, wherein said first and second vacuum/pressure cooling components comprise at least 8 vacuum fittings or from to 8 to 14 vacuum fittings, a vacuum through hole to the waveguide through hole, at least 22 water cooling connections or from 22 to 30 water cooling connections and a liquid cooling channel.

13. The waveguide system of claim 1, wherein said high temperature waveguide comprises a refractory metal and an oxidation protective coating.

14. The waveguide system of claim 13, wherein said refractory metal is selected from the group consisting of molybdenum and molybdenum alloys and said oxidation protective coating is a Silicon/Boron/Carbon oxidation protective coating.

15. The waveguide system of claim 14, wherein said refractory metal is a molybdenum alloy and said Silicon/Boron/Carbon oxidation protective coating has an atomic ratio of Silicon/Boron/Carbon that is 1:10:2.

16. The waveguide system of claim 15, wherein said refractory metal is a Titanium-Zirconium-Molybdenum alloy.

17. The waveguide system of claim 1, wherein each waveguide component's waveguide through hole is axial with respect to each waveguide component.

18. The waveguide system of claim 1, wherein each waveguide component's waveguide through hole is rectangular, square or circular.

19. The waveguide system of claim 13, wherein said oxidation protective coating is coated with a ceramic that comprises zirconium oxide.

20. A diagnostic device comprising the waveguide system of claim 1.

21. The diagnostic device of claim 20, said diagnostic device comprising a vector network analyzer and a computer.

* * * * *